United States Patent
Funaoka et al.

(10) Patent No.: US 9,139,729 B2
(45) Date of Patent: Sep. 22, 2015

(54) RESIN COMPOSITION FOR SEALING ELECTRICAL ELECTRONIC COMPONENTS, METHOD OF PRODUCING ELECTRICAL ELECTRONIC COMPONENT, AND SEALED ELECTRICAL ELECTRONIC COMPONENT

(75) Inventors: Daiki Funaoka, Otsu (JP); Kenji Shiga, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 48 days.

(21) Appl. No.: 14/000,943

(22) PCT Filed: Feb. 21, 2012

(86) PCT No.: PCT/JP2012/054031
§ 371 (c)(1),
(2), (4) Date: Aug. 22, 2013

(87) PCT Pub. No.: WO2012/115065
PCT Pub. Date: Aug. 30, 2012

(65) Prior Publication Data
US 2013/0331521 A1    Dec. 12, 2013

(30) Foreign Application Priority Data

Feb. 23, 2011  (JP) ................................ 2011-036955
Mar. 31, 2011  (JP) ................................ 2011-078162

(51) Int. Cl.
| | |
|---|---|
| *C08L 67/03* | (2006.01) |
| *C08L 23/08* | (2006.01) |
| *C08L 23/06* | (2006.01) |
| *C08L 65/04* | (2006.01) |
| *C08L 71/08* | (2006.01) |
| *C08L 23/02* | (2006.01) |
| *C08L 67/00* | (2006.01) |
| *H01L 23/29* | (2006.01) |
| *C09K 3/10* | (2006.01) |

(52) U.S. Cl.
CPC ............... *C08L 67/03* (2013.01); *C08L 23/02* (2013.01); *C08L 23/06* (2013.01); *C08L 23/08* (2013.01); *C08L 65/04* (2013.01); *C08L 67/00* (2013.01); *C08L 71/08* (2013.01); *C09K 3/10* (2013.01); *H01L 23/293* (2013.01); *C08L 23/0815* (2013.01); *C09K 2200/0617* (2013.01); *C09K 2200/0655* (2013.01); *C09K 2200/0672* (2013.01); *H01L 2924/0002* (2013.01)

(58) Field of Classification Search
CPC ....... C08L 67/025; C08L 67/03; C08L 71/10; C08L 65/04; C08L 61/34; C09K 2200/067; C09K 2200/0672
USPC ........................................................ 525/133
See application file for complete search history.

(56) References Cited

U.S. PATENT DOCUMENTS

| | | | | |
|---|---|---|---|---|
| 2,825,712 | A | | 3/1958 | Witzel |
| 3,954,689 | A | * | 5/1976 | Hoeschele ................ 528/295.3 |
| 4,217,297 | A | | 8/1980 | Lindner et al. |
| 4,254,001 | A | * | 3/1981 | Tung ........................ 528/295.3 |
| 4,297,455 | A | | 10/1981 | Lindner et al. |
| 5,304,593 | A | * | 4/1994 | Nishio et al. ................. 524/451 |
| 5,698,632 | A | * | 12/1997 | Brown et al. ................ 525/133 |
| 5,852,164 | A | | 12/1998 | Akai et al. |
| 5,945,222 | A | | 8/1999 | Nagase et al. |
| 7,381,358 | B2 | | 6/2008 | Nishida et al. |
| 8,030,417 | B2 | | 10/2011 | Maruyama et al. |
| 2002/0026008 | A1 | | 2/2002 | Okamoto et al. |
| 2003/0065070 | A1 | | 4/2003 | Nishida et al. |
| 2003/0165687 | A1 | | 9/2003 | Nishiguchi et al. |
| 2004/0076805 | A1 | * | 4/2004 | Oohori et al. ................ 428/209 |
| 2004/0222564 | A1 | | 11/2004 | Nishida et al. |
| 2009/0215933 | A1 | | 8/2009 | Kasai et al. |
| 2010/0041858 | A1 | | 2/2010 | Maruyama et al. |
| 2013/0331521 | A1 | | 12/2013 | Funaoka et al. |

FOREIGN PATENT DOCUMENTS

| | | |
|---|---|---|
| EP | 0 323 914 | 7/1989 |
| EP | 1 167 448 | 1/2002 |
| EP | 2 679 651 | 1/2014 |
| JP | 54-4990 | 1/1979 |
| JP | 60-18562 | 1/1985 |
| JP | 62-549 | 1/1987 |

(Continued)

OTHER PUBLICATIONS

Machine Translation of JP 2010150471.*
Machine Translation of JP 05175371.*
International Search Report issued May 29, 2012 in International (PCT) Application No. PCT/JP2012/054031.
United States Office Action issued Dec. 18, 2014 in U.S. Appl. No. 14/003,061.
International Search Report issued May 29, 2012 in International (PCT) Application No. PCT/JP2012/054030.
Extended European Search Report issued Aug. 13, 2014 in corresponding European Patent Application No. 12757600.7.
International Search Report issued Sep. 18, 2012 in International (PCT) Application No. PCT/JP2012/071154.

*Primary Examiner* — Mike M Dollinger
(74) *Attorney, Agent, or Firm* — Wenderoth, Lind & Ponack, L.L.P.

(57) ABSTRACT

It is provided that a resin composition for sealing electrical electronic components which is not susceptible to gelation even when stagnant under high temperature conditions, and which are excellent in initial bond strength to an aluminum material, and which exhibits superior durability under a cooling and heating cycle load and the like. It is also provided that a sealed electrical electronic component with the resin composition for sealing electrical electronic components. A resin composition for sealing electrical electronic components, containing a crystalline polyester-based elastomer (A), a phenol-modified xylene resin (B1) and/or a phenol resin (B2), and a polyolefin resin (C), and having a melt viscosity of 5 dPa·s or more and 3000 dPa·s or less when dried to a water content of 0.1% or less, heated to 220° C., subjected to a pressure of 1 MPa, and extruded through a die with a hole diameter of 1.0 mm and a thickness of 10 mm.

8 Claims, No Drawings

(56) References Cited

FOREIGN PATENT DOCUMENTS

| | | |
|---|---|---|
| JP | 62-74955 | 4/1987 |
| JP | 62-112652 | 5/1987 |
| JP | 1-236268 | 9/1989 |
| JP | 5-175371 | 7/1993 |
| JP | 5-295094 | 11/1993 |
| JP | 2000-178351 | 6/2000 |
| JP | 2000-178420 | 6/2000 |
| JP | 2001-206939 | 7/2001 |
| JP | 2001-240663 | 9/2001 |
| JP | 2003-192778 | 7/2003 |
| JP | 2004-83918 | 3/2004 |
| JP | 3553559 | 5/2004 |
| JP | 2004-269625 | 9/2004 |
| JP | 2005-68576 | 3/2005 |
| JP | 2007-138139 | 6/2007 |
| JP | 2007-191664 | 8/2007 |
| JP | 2007-191665 | 8/2007 |
| JP | 2008-163226 | 7/2008 |
| JP | 4389144 | 10/2009 |
| JP | 2010-150471 | 7/2010 |
| WO | 2008/093574 | 8/2008 |

* cited by examiner

RESIN COMPOSITION FOR SEALING ELECTRICAL ELECTRONIC COMPONENTS, METHOD OF PRODUCING ELECTRICAL ELECTRONIC COMPONENT, AND SEALED ELECTRICAL ELECTRONIC COMPONENT

TECHNICAL FIELD

The present invention relates to a sealed electrical electronic component sealed by a resin composition, its production method, and a resin composition suitable for this application.

BACKGROUND ART

It is indispensable for an electrical electronic component used widely in vehicles and electrical appliances to be electrically insulated from outsides for satisfying its use purpose. For example, an electrical wire is coated with a resin having an electrical insulation property. Today, applications in which electrical electronic components with complicated shapes are required to be packed in a small capacity, e.g., mobile phones, are sharply increased and in such a situation, various methods for their electrical insulation are employed. Particularly, in the case where an electrical electronic component having a complicated shape such as a circuit board is sealed with a resin serving as an electrical insulator, a sealing method for reliably following the shape of the electrical electronic component without leaving any un-packed portion is required. For that, it is common to employ a method for decreasing the viscosity of a sealing resin composition at the time of coating. A hot melt resin for sealing whose viscosity is lowered only by heating and melting to make sealing possible can be solidified to give a sealed body merely by cooling after sealing and thus has a high productivity, and in addition, since a thermoplastic resin is commonly used therefor, the resin can be melted and removed by heating after the life as a product is finished, thereby easily making recycling of the component possible.

Further, in vehicle applications, a heat generating body often exists in an electronic substrate installed in an engine room or the like, and therefore, a countermeasure of installing a heat releasing plate made of aluminum is taken in order to prevent heat storage. Still further, for making a wire harness for vehicles lightweight, shift from a copper wire to an aluminum wire has been promoted. In such a situation, a sealing material has been frequently required to have bond property to aluminum.

Having both a high electrical insulation property and water-proofness, a polyester is supposed to be a very useful material for the above-mentioned application; however, in general, a polyester has a high melt viscosity and it is necessary to carry out injection molding at a high pressure of several hundred MPa or more in the case of sealing a component with a complicated shape, and there is a risk of breaking an electrical electronic component. Patent Document 1 discloses an adhesive composition for a structure, containing a specified polytetramethylene glycol copolymerized polyether ester elastomer and an epoxy compound having at least 1.2 or more of glycidyl groups on a number average basis in the molecule. Herein, the polyester resin used herein has good initial bond property but tends to have high crystallinity, and thus generates strain energy at the time of transfer from the amorphous state to the crystalline state after bonding, and therefore, the bond strength tends to be lowered significantly and the polyester resin is unsuitable for a sealing material for electrical electronic components.

Patent Documents 2 and 3 propose a hot melt resin composition for sealing having a melt viscosity that enables sealing at a low pressure so as not to damage electrical electronic components. The resin composition allows molded components with good initial bond property to be obtained and allows a polyester-based resin composition to be applied to common electrical electronic components. However, the resin composition have a problem that if the resin composition is, for example, exposed to a cooling and heating cycle at −40° C. and 80° C., repeatedly many times for a long duration, the bond strength is rather considerably lowered and at the same time, the sealing state cannot be maintained in some cases.

Patent Document 4 discloses a resin composition for sealing electrical electronic components, in which a crystalline polyester resin, an epoxy resin, and a polyolefin resin are blended. This composition has a high adhesion strength and is durable for a cooling and heating cycle load; however, the composition has a problem that a blended product containing glycidyl may cause gelation and aggregation due to curing if stagnated under high temperature.

Patent Document 5 discloses that a hot melt adhesive composition in which a specified polyester resin and a phenol-modified xylene resin are blended shows a good adhesion property to tinned copper and a biaxially stretched poly(ethylene terephthalate) film. This adhesive composition also has a problem that the adhesion durability is insufficient to a cooling and heating cycle at −40° C. for 30 minutes and 80° C. for 30 minutes in automotive applications or the like.

PRIOR ART DOCUMENTS

Patent Documents

Patent Document 1: JP-A-Sho-60-18562
Patent Document 2: Japanese Patent No. 3553559
Patent Document 3: JP-A-2004-83918
Patent Document 4: JP-A-2010-150471
Patent Document 5: Japanese Patent No. 4389144

SUMMARY OF THE INVENTION

Problems to be Solved by the Invention

As described above, no conventional technique has proposed a resin composition which can sufficiently satisfy all of the required performances as a resin composition for sealing electrical electronic components having complicated shapes.

A first object of the present invention is to provide a sealed electrical electronic component which is not susceptible to gelation even when stagnant under high temperature conditions, and which exhibits superior durability under a cooling and heating cycle load and the like, and to provide a method for producing a sealed electrical electronic component suitable for this and a resin composition for sealing electrical electronic components. More practically, the object of the present invention is to provide a resin composition for sealing electrical electronic components which is not considerably lowered in the elongation and strength even after 1000 cycle load of cooling and heating cycles at −40° C. for 30 minutes and 80° C. for 30 minutes and which is usable in environments where high durability to the cooling and heating cycle load is required. A second object of the present invention is to provide a sealed electrical electronic component which is not susceptible to gelation even when stagnant under high temperature conditions, and which exhibits superior durability under a cooling and heating cycle load and a high temperature long time load, and to provide a method for producing a sealed electrical electronic component suitable for this and a resin composition for sealing electrical electronic components. More practically, the object of the present invention is to provide a resin composition for sealing electrical electronic components which is not considerably lowered in the elongation and strength even after 1000 cycle load of cooling and heating cycles at −40° C. for 30 minutes and 150° C. for 30 minutes and a high temperature long time load at 150° C. for 1000 hours and which is usable in environments of an automotive engine room or the like where high durability to the cooling and heating cycle load and high temperature long time load is required.

Solutions to the Problems

To achieve the above-mentioned objects, the present inventors have made various investigations and proposed the following invention.

That is, the present invention is (1) A resin composition for sealing electrical electronic components, containing
a crystalline polyester-based elastomer (A),
a phenol-modified alkylbenzene resin (B1) and/or a phenol resin (B2), and
a polyolefin resin (C),
and having a melt viscosity of 5 dPa·s or more and 3000 dPa·s or less when dried to a water content of 0.1% or less, heated to 220° C., subjected to a pressure of 1 MPa, and extruded through a die with a hole diameter of 1.0 mm and a thickness of 10 mm.

(2) The resin composition for sealing electrical electronic components according to (1), wherein the crystalline polyester-based elastomer (A) is one resin or a mixture of 2 or more resins selected from the group consisting of a crystalline polyester resin (A1) being copolymerized with a polyether component, a crystalline polyester resin (A2) being copolymerized with a polycarbonate component, and a crystalline polyester resin (A3) being copolymerized with a polylactone component.

(3) The resin composition according to (1) or (2), wherein the phenol-modified alkylbenzene resin (B1) is an alkylphenol-modified alkylbenzene resin and has a hydroxyl value of 100 equivalent/$10^6$ g or more.

(4) The resin composition according to any one of (1) to (3), wherein the phenol resin (B2) is a novolak type phenol resin and has a hydroxyl value of 100 equivalent/$10^6$ g or more.

(5) The resin composition according to any one of (1) to (4), wherein 0.1 to 100 parts by weight in total of the phenol-modified alkylbenzene resin (B1) and the phenol resin (B2) and 0.1 to 100 parts by weight of the polyolefin resin (C) are blended with 100 parts by weight of the crystalline polyester-based elastomer (A).

(6) The resin composition for sealing electrical electronic components according to any one of (1) to (5), having a T type peeling strength retention ratio of 50% or more after applying 1000 cycles of cooling and heating cycle at −40° C. for 30 minutes and at 80° C. for 30 minutes for an aluminum plate.

(7) The resin composition for sealing electrical electronic components according to any one of (1) to (6), having an initial T type peeling strength of 0.5 N/mm or more for an aluminum plate.

(8) A method for producing a sealed electrical electronic component by heating and kneading the resin composition according to any one of claims (1) to (7) and thereafter injecting the resin composition into a mold including an inserted electrical electronic component at a resin composition temperature of 130° C. or higher and 260° C. or lower and at a resin composition pressure of 0.1 MPa or more and 10 MPa or less.

(9) A sealed electrical electronic component sealed with the resin composition according to any one of claims (1) to (7).

Effect of the Invention

Being excellent in melt fluidity, a resin composition for sealing electrical electronic components of the present invention can be molded without causing short shot even at a relatively low pressure in the case of using the resin composition as a sealing material for electrical electronic components. The resin composition for sealing electrical electronic components is also excellent in initial bond strength to various members including an aluminum material and keeps a high bond property even after being subjected to a cooling and heating cycle load and exhibits high bond durability to cooling and heating cycles. Therefore, a sealed electrical electronic component sealed by using the resin composition for sealing electrical electronic components of the present invention exhibits durability to severe environmental loads such as a cooling and heating cycle. Being excellent in melt fluidity, a resin composition for sealing electrical electronic components of a particular embodiment of the present invention can be molded without causing short shot even at a relatively low pressure in the case of using the resin composition as a sealing material for electrical electronic components. Further, the resin composition for sealing electrical electronic components is excellent in initial bond property to various members including an aluminum material and exhibits high cooling and heating cycle durability so as to keep adhesion strength even after being subjected to a cooling and heating cycle load of 1000 cycles of −40° C. for 30 minutes and 150° C. for 30 minutes, and also exhibits a high heat aging resistance so as to keep fracture elongation even after being subjected to a high temperature long time load at 150° C. for 1000 minutes. Therefore, a sealed electrical electronic component sealed by using the resin composition for sealing electrical electronic components of the present invention exhibits durability to severe environmental loads such as a cooling and heating cycle and a high temperature long time load.

MODE FOR CARRYING OUT THE INVENTION

A sealed electrical electronic component of the present invention can be produced by injecting a resin or a resin composition provided with fluidity by heating and kneading into a mold, in which an electrical electronic component is set, at a low pressure of 0.1 to 10 MPa. The electrical electronic component is sealed entirely or partially while being enclosed with the injected resin. As compared with injection molding at a high pressure of 40 MPa or higher which is conventionally generally employed for molding a plastic, the above procedure is carried out at a very low pressure, and while it is sealing by an injection molding method, it can seal an electrical electronic component having limited heat resistance and pressure resistance without breaking the electrical electronic component. A sealing resin or a sealing resin composition can be properly selected to thereby obtain a sealed component with bond durability, even to a metal member including an aluminum material, enough to stand environmental loads such as a cooling and heating cycle load and a high temperature long time load. Hereinafter, preferred embodiments will be described successively in detail.

A resin composition for sealing electrical electronic components contain a crystalline polyester-based elastomer (A), a phenol-modified alkylbenzene resin (B1) and/or a phenol resin (B2), and a polyolefin resin (C), and having a melt viscosity of 5 dPa·s or more and 3000 dPa·s or less when dried to a water content of 0.1% or less, heated to 220° C., subjected to a pressure of 1 MPa, and extruded through a die with a hole diameter of 1.0 mm and a thickness of 10 mm. The crystalline polyester-based elastomer (A) in the present invention is a polyester having a chemical structure formed by condensation polymerization of a polyvalent carboxylic acid compound and a polyhydric alcohol compound and having a glass transition temperature of 0 degrees C. or lower and a melting temperature of 100 degrees C. or higher. Representative examples of the crystalline polyester-based elastomer (A) in the present invention may include a crystalline polyester resin (A1) being copolymerized with a polyether component; a crystalline polyester resin (A2) being copolymerized with a polycarbonate component; and a crystalline polyester resin (A3) being copolymerized with a polylactone component. A crystalline polyester-based elastomer can be obtained also by copolymerizing an aliphatic dicarboxylic acid of 10 or more carbon atoms such as a dimer acid and a hydrogenated dimer acid, and/or an aliphatic and/or alicyclic diol of 10 or more carbon atoms such as a dimer diol and a hydrogenated dimer diol, and introducing a block-like segment into a polyester resin.

Preferable examples of the crystalline polyester-based elastomer (A) to be used in the present invention may include a crystalline polyester resin (A1) being copolymerized with a polyether component. The crystalline polyester resin (A1) is provided with characteristics such as a low melt viscosity, high flexibility, and a high bond property owing to copolymerization of a polyether component. The above-mentioned polyether component is copolymerized in the crystalline polyester resin (A1) by using typically a polyether diol as a raw material. The copolymerization ratio of the polyether component is preferably 1% by mole or more, more preferably 5% by mole or more, furthermore preferably 10% by mole or more, and particularly preferably 20% by mole or more in total 100% by mole of all glycol components constituting the above-mentioned crystalline polyester resin (A1). In addition, it is preferably 90% by mole or less, more preferably 55% by mole or less, furthermore preferably 50% by mole or less, and particularly preferably 45% by mole or less. If the copolymerization ratio of the polyether component is too low, it tends to result in occurrence of a problem that the melt viscosity is made so high as to make low pressure molding impossible or that the crystallization speed is made so high as to cause short shot. On the other hand, if the copolymerization ratio of the polyether component is too high, it tends to result in occurrence of a problem that the heat resistance is insufficient. The number average molecular weight of the polyether component is preferably 400 or more and more preferably 800 or more. If the number average molecular weight is too low, it tends to result in occurrence of a problem that flexibility cannot be provided and the stress load on an electronic substrate is made high after sealing. In addition, the number average molecular weight of the polyether component is preferably 5000 or less and more preferably 3000 or less. If the number average molecular weight is too high, it tends to result in occurrence of a problem that compatibility with other components is deteriorated and copolymerization is impossible. Specific examples of the raw materials of the polyether component may include polyethylene glycol, polytrimethylene glycol, and polytetramethylene glycol, and in terms of the effect of increasing the flexibility and the effect of lowering the melt viscosity of the crystalline polyester resin (A1) to be obtained, polytetramethylene glycol is most preferable.

In the constituent components of the crystalline polyester-based elastomer (A) to be used in the present invention, the composition ratio of an aliphatic component and/or an alicyclic component to an aromatic component can be adjusted to simultaneously satisfy both of a low melt viscosity which general-purpose crystalline polyester resins used widely as engineering plastics, such as poly(ethylene terephthalate) (hereinafter, sometimes abbreviated as PET) and poly(butylene terephthalate) (hereinafter, sometimes abbreviated as PBT) do not have, and a heat resistance, a high temperature and high humidity resistance and a cooling and heating cycle resistance which are comparative with those of a two-liquid curable epoxy resin. For example, in order to exhibit a high heat resistance of 150° C. or higher, copolymerized polyesters containing, as a base, terephthalic acid and ethylene glycol, terephthalic acid and 1,4-butanediol, naphthalene dicarboxylic acid and ethylene glycol, and naphthalene dicarboxylic acid and 1,4-butanediol are preferable. Particularly, it is preferable to use terephthalic acid in combination with 1,4-butanediol, and naphthalenedicarboxylic acid in combination with 1,4-butanediol, which can be quickly crystallized, as main components since quick crystal solidification after molding improves the mold-releasing property and it is a desirable characteristic in terms of improvement of productivity.

An acid component constituting the crystalline polyester-based elastomer (A) preferably contains both or one of terephthalic acid and naphthalenedicarboxylic acid in terms of heat resistance. The copolymerization ratio of terephthalic acid and naphthalenedicarboxylic acid in total is preferably 65% by mole or more, more preferably 70% by mole or more, and particularly preferably 80% by mole or more in total 100% by mole of acid components. If the total of terephthalic acid and naphthalenedicarboxylic acid is too low, heat resistance necessary for electrical electronic components may be insufficient.

An acid component constituting the crystalline polyester-based elastomer (A) preferably contains both or one of ethylene glycol and 1,4-butanediol in terms of crystalline retention when copolymerized. The copolymerization ratio of ethylene glycol and 1,4-butanediol in total is preferably 40% by mole or more, more preferably 45% by mole or more, and particularly preferably 50% by mole or more in total 55% by mole of glycol components. If the total of ethylene glycol and 1,4-butanediol is too low, the crystallization speed is lowered and moldability is impaired, e.g., mold-releasing property is deteriorated and molding time is longer, and further, the crystallinity may be insufficient and also the heat resistance may be insufficient.

In the crystalline polyester-based elastomer (A) to be used in the present invention, it is possible to use, as a copolymerization component, an aliphatic or alicyclic dicarboxylic acid such as adipic acid, azelaic acid, sebacic acid, 1,4-cyclohexanedicarboxylic acid, 1,3-cyclohexanedicarboxylic acid, 1,2-cyclohexanedicarboxylic acid, 4-methyl-1,2-cyclohexanedicarboxylic acid, a dimer acid, and a hydrogenated dimer acid, and an aliphatic or alicyclic glycol such as 1,2-propanediol, 1,3-propanediol, 1,2-butanediol, 1,3-butanediol, 2-methyl-1,3-propanediol, 1,5-pentanediol, 1,6-hexanediol, 3-methyl-1,5-pentanediol, neopentyl glycol, diethylene glycol, dipropylene glycol, 2,2,4-trimethyl-1,3-pentanediol, cyclohexanedimethanol, tricyclodecanedimethanol, neopentyl glycol hydroxypivalic acid ester, 1,9-nonanediol, 2-methyloctanediol, 1,10-dodecanediol, 2-butyl-2-ethyl-1,3-propanediol, polytetramethylene glycol, and polyoxymethylene glycol, for the basic composition containing the above-mentioned acid components and glycol components for providing a high heat resistance, and the bond property of the resin composition of the present invention can be further improved in some cases.

If an aliphatic and/or alicyclic dicarboxylic acid of 10 or more carbon atoms such as a dimer acid and a hydrogenated dimer acid, and/or an aliphatic and/or alicyclic diol of 10 or more carbon atoms such as a dimer diol and a hydrogenated dimer diol is copolymerized with the crystalline polyester-based elastomer (A) to be used in the present invention, the glass transition temperature can be lowered while the high melting point being maintained, and compatibility of heat resistance and bond property to an electrical electronic component of the resin composition of the present invention may be further improved in some cases.

Further, if an aliphatic or alicyclic dicarboxylic acid of 10 or more carbon atoms such as a dimer acid and a hydrogenated dimer acid, and/or an aliphatic or alicyclic diol of 10 or more carbon atoms, as well as a block-like segment containing an aliphatic component with a relatively high molecular weight represented by polyalkylene ether glycols such as polytetramethylene glycol and polylactones such as polycaprolactone are introduced into the crystalline polyester-based elastomer (A), the glass transition temperature of the crystalline polyester-based elastomer (A) can be lowered so that the cooling and heating cycle durability is improved and the ester group concentration is lowered so that hydrolysis resistance is improved, and therefore in the case where durability after molding is important, it is a desirable measure. Herein, the cooling and heating durability is a property that separation in the interface of an electronic component and a sealing resin with different linear expansion coefficients or cracking of a sealing resin is hardly caused even if temperature increase to a high temperature and decrease to a low temperature are repeated many times. If the elastic modulus of a resin is considerably increased at the time of cooling, peeling off and cracking tend to be easily caused. The glass transition temperature is preferably −10° C. or lower for providing a material durable to cooling and heating cycles. The glass transition temperature is more preferably −20° C. or lower, furthermore preferably −40° C. or lower, and most preferably −50° C. or lower. The lower limit is not particularly limited, and in consideration of bond property and blocking resistance, it is practically −100° C. or higher.

Herein, the dimer acid means an aliphatic or alicyclic dicarboxylic acid (containing mostly dimers, and several % by mole of a trimer, a monomer and the like, in many cases) produced by dimerizing an unsaturated fatty acid by polymerization, Diels-Alder reaction or the like, and the hydrogenated dimer acid means an acid by adding hydrogen to the unsaturated linkage part of the dimer. The dimerdiol and the hydrogenated dimerdiol mean those obtained by reducing two carboxyl groups of the dimer acid and the hydrogenated dimer acid to hydroxyl groups. Specific examples of the dimer acid and dimer diol include Empol (registered trade name) and Sovermol (registered trade name) manufactured by Cognis, and Pripol (registered trade name) manufactured by Uniqema. The polylactone is a polymer or an oligomer having a structure obtained by ring-opening polymerization of a lactone such as γ-butyrolactone, δ-valerolactone, and ε-caprolactone and an example includes Placcel (registered trade name) manufactured by Daicel Corporation.

On the other hand, in the crystalline polyester-based elastomer (A) to be used in the present invention, a small amount of an aromatic copolymerizable component may be used to such an extent that a low melt viscosity is maintained. Preferable examples of the aromatic copolymerizable component include aromatic dicarboxylic acids such as isophthalic acid and o-phthalic acid, and aromatic glycols such as a bisphenol A ethylene oxide adduct and a propylene oxide adduct. Particularly, an aliphatic component with a relatively high molecular weight such as a dimer acid and a dimer diol can be introduced to thereby give a good mold-releasing property owing to quick crystal solidification after molding in some cases.

For providing long time durability to a sealed electrical electronic component, the upper limit of the ester group concentration of the crystalline polyester-based elastomer (A) is preferably 8000 equivalent/$10^6$ g in order to provide hydrolysis resistance durable to high temperature and high humidity. The upper limit is preferably 7500 equivalent/$10^6$ g and more preferably 7000 equivalent/$10^6$ g. The lower limit is 1000 equivalent/$10^6$ g for reliably obtaining chemical resistance (to gasoline, engine oil, alcohol, general-purpose solvents, and the like). The lower limit is preferably 1500 equivalent/$10^6$ g and more preferably 2000 equivalent/$10^6$ g. Herein, the unit of the ester group concentration is expressed by the number of equivalent per $10^6$ g of the resin, and is a numeral value calculated by composition of the polyester resin and its copolymerization ratio.

In the case where a block-like segment is introduced into the polyester resin (A) of the present invention by copolymerizing an aliphatic or alicyclic dicarboxylic acid of 10 or more carbon atoms such as a dimer acid, a hydrogenated dimer acid, a dimer diol, and a hydrogenated dimer diol, and/or an aliphatic or alicyclic diol of 10 or more carbon atoms, the content of the crystalline polyester resin is preferably 2% by mole or more, more preferably 5% by mole or more, furthermore preferably 10% by mole or more, and most preferably 20% by mole or more in total 200 mole % of all of the acid components and the glycol components in the polyester resin (A). The upper limit is preferably 70% by mole or less, more preferably 60% by mole or less, and furthermore preferably 50% by mole or less in consideration of handling properties such as heat resistance and blocking.

Preferable examples of the crystalline polyester-based elastomer (A) to be used in the present invention include a crystalline polyester resin (A2) being copolymerized with a polycarbonate component. The crystalline polyester resin (A2) preferably has a chemical structure formed by linking a hard segment, which mainly contains a polyester segment, and a soft segment, which mainly contains a polycarbonate segment, by an ester bond.

The soft segment, mainly containing a polycarbonate segment, constituting the crystalline polyester resin (A2) to be used in the present invention can be formed by copolymerization of a polycarbonate component, typically a polycarbonate diol. The polycarbonate component can be copolymerized with thereby provide characteristics such as a low melt viscosity, high flexibility, and a high bond property. The soft segment is preferably at 25% by weight or more, more preferably 30% by weight or more, and particularly preferably 35% by weight or more in total 100% by weight of all hard segment components constituting the above-mentioned crystalline polyester resin (A2). The soft segment is preferably at 75% by weight or less, more preferably 70% by weight or less, and particularly preferably 65% by weight or less. If the copolymerization ratio of the soft segment is too low, it tends to result in occurrence of a problem that the melt viscosity is so high as to require a high pressure for molding or that the crystallization speed is made so high as to easily cause short shot. On the other hand, if the copolymerization ratio of the soft segment is too high, it tends to result in occurrence of a problem that the heat resistance is insufficient. The polycarbonate component constituting the soft segment is preferably an aliphatic polycarbonate component mainly containing a poly(alkylene carbonate) component. Herein, "mainly containing" means that the poly(alkylene carbonate) component accounts for 50% by weight or more, more preferably 75% by weight or more, and furthermore preferably 90% by weight or more of the aliphatic polycarbonate component. An alkylene group constituting the poly(alkylene carbonate) is preferably a straight chain alkylene of 4 to 16 carbon atoms, and a longer chain alkylene group tends to be more excellent in durability to a cooling and heating cycle load. In consideration of availability, the alkylene group is preferably a tetramethylene group, a pentamethylene group, a hexamethylene group, an octamethylene group, and a nonamethylene group. The alkylene group constituting the poly(alkylene carbonate) may be a copolymerizable type of polycarbonate which contains a mixture of two or more alkylene groups.

The hard segment constituting the crystalline polyester resin (A2) to be used in the present invention is preferably a heat resistant crystalline polyester segment such as poly(ethylene terephthalate) (PET), poly(butylene terephthalate) (PBT), poly(ethylene naphthalate) (PEN), and poly(butylene naphthalate) (PBN). PBT and PBN are more preferable. If other crystalline polyesters are used, heat resistance may be insufficient, and durability and low temperature characteristics may be deteriorated in some cases.

On the other hand, in the crystalline polyester resin (A2) to be used in the present invention, a small amount of an aromatic copolymerizable component may be used to such an extent that the low melt viscosity can be maintained. Preferable examples of the aromatic copolymerizable component include aromatic dicarboxylic acids such as isophthalic acid and o-phthalic acid, and aromatic glycols such as a bisphenol A ethylene oxide adduct and a propylene oxide adduct. On the other hand, an aliphatic component with a relatively high molecular weight such as a dimer acid and a dimer diol can be introduced to thereby give a good mold-releasing property owing to quick crystal solidification after molding in some cases.

Also regarding the crystalline polyester resin (A2) to be used in the present invention, in the case where a block-like segment is introduced into the polyester resin (A) of the present invention by copolymerizing an aliphatic or alicyclic dicarboxylic acid of 10 or more carbon atoms such as a dimer acid, a hydrogenated dimer acid, a dimer diol, and a hydrogenated dimer diol, and/or an aliphatic or alicyclic diol of 10 or more carbon atoms, the content of the crystalline polyester resin is preferably 2% by mole or more, more preferably 5% by mole or more, furthermore preferably 10% by mole or more, and most preferably 20% by mole or more in total 200 mole % of all of the acid components and the glycol components in the polyester resin (A). The upper limit is preferably 70% by mole or less, more preferably 60% by mole or less, and furthermore preferably 50% by mole or less in consideration of handling properties such as heat resistance and blocking.

The number average molecular weight of the crystalline polyester-based elastomer (A) to be used in the present invention is preferably 3000 or more, more preferably 5000 or more, and furthermore preferably 7000 or more. The upper limit of the number average molecular weight is preferably 50000 or less, more preferably 40000 or less, and furthermore preferably 30000 or less. If the number average molecular weight is less than 3000, the hydrolysis resistance and strong elongation retention under high temperature and high humidity of the resin composition for sealing may be insufficient, and if it exceeds 50000, the melt viscosity at 220° C. may be high.

The crystalline polyester-based elastomer (A) to be used in the present invention is preferably a saturated polyester resin having no unsaturated group. In the case of an unsaturated polyester containing an unsaturated group in a high concentration, crosslinking may be caused at the time of melting and thus it may result in inferior melt stability. The crystalline polyester-based elastomer (A) to be used in the present invention may contain an unsaturated group if its amount is very small.

The crystalline polyester-based elastomer (A) to be used in the present invention may be a polyester having branches by copolymerizing a tri- or higher functional polyvalent carboxylic acid or polyol such as trimellitic anhydride or trimethylolpropane if necessary.

The phenol-modified alkylbenzene resin (B1) to be used for the resin composition of the present invention is preferably one obtained by modifying an alkylbenzene resin with phenol and/or an alkylphenol, and having a number average molecular weight in a range of 450 to 40,000. The phenol-modified alkylbenzene resin (B1) can be produced by, for example, allowing an alkylbenzene such as xylene or mesitylene and aldehydes such as formaldehyde to react in the presence of an acidic catalyst to produce an alkylbenzene resin, and allowing the alkylbenzene resin to react with phenols and aldehydes in the presence of an acidic catalyst. The phenol-modified alkylbenzene resin (D2) is preferably an alkylphenol-modified xylene resin or an alkylphenol-modified mesitylene resin. A xylene resin is a multimer composition having a basic structure formed by crosslinking a xylene structure with a methylene group and an ether bond, and is typically obtained by heating m-xylene and formaldehyde in the presence of sulfuric acid. A mesitylene resin is a multimer composition having a basic structure formed by crosslinking a mesitylene structure with a methylene group and an ether bond, and is typically obtained by heating mesitylene and formaldehyde in the presence of sulfuric acid. A xylene resin and a mesitylene resin are typical alkylbenzene resins. The hydroxy value of the phenol-modified xylene resin (B1) of the present invention is preferably 100 equivalent/$10^6$ g or more, more preferably 1000 equivalent/$10^6$ g or more, and furthermore preferably 5000 equivalent/$10^6$ g or more. It is preferably 20000 equivalent/$10^6$ g or less and more preferably 15000 equivalent/$10^6$ g or less. If the hydroxyl value is too low, the bond property to an aluminum material tends to be deteriorated, and if the hydroxyl value is too high, the water absorption property is increased and the insulation property tends to be deteriorated. Herein, the hydroxyl value is measured by JIS K 1557-1:2007A method.

The phenol resin (B2) to be used for the resin composition of the present invention is a resin obtained by reaction of phenols and aldehydes and may be a novolak type phenol resin or a cresol type phenol resin, and those having a number average molecular weight in a range of 450 to 40,000 are preferable. Examples of phenols that can be used as a starting raw material for the phenol resin may include bifunctional phenols such as o-cresol, p-cresol, p-tert-butylphenol, p-ethylphenol, 2,3-xylenol, and 2,5-xylenol; trifunctional phenols such as phenol, m-cresol, m-ethylphenol, 3,5-xylenol, and m-methoxyphenol; tetrafunctional phenols such as bisphenol A and bisphenol F; and one or more of these phenols in combination. Formaldehydes to be used for producing the phenol resin may be one or more of formaldehyde, p-formaldehyde and trioxane in combination. Additionally, phenol-modified resins such as phenolaralkyls and phenol-modified xylene resins are also usable. Among them, those which have good compatibility with the crystalline polyester-based elastomer (A) are preferable for exhibiting a high bond force. To obtain a phenol resin with good compatibility with the crystalline polyester-based elastomer (A), it is preferable to have close melt viscosity and a hydroxyl group. The phenol resin (B2) of the present invention is preferably 100 equivalent/$10^6$ g or more, more preferably 500 equivalent/$10^6$ g or more, and furthermore preferably 1000 equivalent/$10^6$ g or more. It is preferably 10000 equivalent/$10^6$ g or less and more preferably 5000 equivalent/$10^6$ g or less. If the hydroxyl value is too low, the bond property to an aluminum material tends to be deteriorated, and if the hydroxyl value is too high, the water absorption property is increased and the insulation property tends to be deteriorated. Herein, the hydroxyl value is measured by JIS K 1557-1:2007A method.

In the present invention, the phenol-modified xylene resin (B1) and/or the phenol resin (B2) can be blended with the resin composition for sealing to thereby provide excellent characteristics such as good initial bond property and bond durability for cooling and heating cycles at the time of sealing an electrical electronic component. It is supposed that the phenol-modified xylene resin (B1) and/or the phenol resin (B2) exhibits a stress relaxation effect by delay of crystallization of the crystalline polyester-based elastomer (A), an effect as a dispersion aid of the crystalline polyester-based elastomer (A) and the polyolefin resin (C), and an effect of improving the wettability to a substrate owing to introduction of the functional groups. The amount of the phenol-modified xylene resin (B1) and/or the phenol resin (B2) to be blended in the present invention is preferably 0.1 parts by weight or more, more preferably 1 part by weight or more, and furthermore preferably 3 parts by weight or more to 100 parts by mass of the crystalline polyester-based elastomer (A). It is also preferably 100 parts by weight or less, more preferably 50 parts by weight or less, and furthermore preferably 20 parts by weight or less. If the rate of the phenol-modified xylene resin (B1) and/or the phenol resin (B2) to be blended is too low, the stress relaxation effect by delay of crystallization is not exhibited in some cases, and the function of the polyolefin resin (C) and the crystalline polyester-based elastomer (A) as a dispersion aid is also not exhibited in some cases. If the rate of the phenol-modified xylene resin (B1) and/or the phenol resin (B2) to be blended is too high, the productivity of the resin composition is inferior, and the flexible characteristic as a sealed component may be inferior.

The polyolefin resin (C) to be used in the present invention is not particularly limited and a polyolefin resin with low crystallinity is preferably used. A low crystallinity polyolefin resin tends to have a low density as compared with a common polyolefin resin, and those having a density of 0.75 g/cm$^3$ or more and less than 0.91 g/cm$^3$ are preferable. A polyolefin resin with low crystallinity and a low density can be used as the polyolefin resin (C) to thereby easily micro-disperse and mix the polyolefin resin (C) in and with the crystalline polyester-based elastomer (A), which is intrinsically non-compatible, and give a uniform resin composition by a common biaxial extruder. Further, a polyolefin resin with a low density and also low crystallinity is used as the polyolefin resin (C) to give a proper effect for relaxing the residual stress with the lapse of time which is generated in the crystalline polyester-based elastomer (A) at the time of injection molding, and exhibit preferable characteristics as a sealing resin such as long time bond durability and lessening of stress generated by environmental loads. As the polyolefin resin (C) having such characteristics, polyethylene and ethylene copolymers are particularly preferable in terms of easy availability and economy as well as no adverse effect on the bond property to a metal and a film. Further, specific examples may include low density polyethylene, ultra low density polyethylene, straight chain low density polyethylene, an ethylene-α-olefin copolymer, an ethylene-propylene elastomer, and an ethylene-butylene copolymer.

Further, those not containing a polar group such as a carboxyl group and a glycidyl group are preferable for the polyolefin resin (C). If a polar group exists, the compatibility with the crystalline polyester-based elastomer (A) is changed and thus the stress energy of the polyester resin (A) at the time of crystallization cannot be relaxed in some cases. In general, a polyolefin having a polar group has a tendency of having high compatibility with a polyester resin as compared with a polyolefin having no polar group; however, in the present invention, if the compatibility is increased, the decrease in bond property with the lapse of time rather tends to be significant.

Still further, it is preferable for the polyolefin resin (C) of the present invention to have a melt mass flow rate (hereinafter, abbreviated as MFR) of 3 to 20 g/10 min measured in condition D of JIS K7210-1999 (testing temperature 190° C. and nominal load 2.16 kg). If MFR is less than 5, the melt viscosity is too high, and thus the compatibility with the crystalline polyester-based elastomer (A) is deteriorated and the bond property may be impaired, and if MFR is 20 or more, the viscosity is low and the resin composition is extremely easily softened as a bonding agent composition, and the mechanical physical properties may be inferior.

In the present invention, the polyolefin resin (C) is blended with the resin composition for sealing to provide excellent characteristics such as good initial bond property and bond durability to environmental loads such as cooling and heating cycles at the time of sealing electrical electronic components. It is supposed that the polyolefin resin (C) exhibits an effect of relaxing strain energy generated by crystallization of the crystalline polyester-based elastomer (A) and relaxation of enthalpy. The amount of the polyolefin resin (C) to be blended in the present invention is preferably 0.5 parts by weight or more, more preferably 3 part by weight or more, and furthermore preferably 5 parts by weight or more to 100 parts by mass of the crystalline polyester-based elastomer (A). It is also preferably 50 parts by weight or less, more preferably 30 parts by weight or less, and furthermore preferably 15 parts by weight or less. If the rate of the polyolefin resin (C) to be blended is too low, it becomes difficult to relax the strain energy generated by crystallization of the crystalline polyester-based elastomer (A) and enthalpy relaxation, and therefore, the bond strength tends to be lowered. In the case where the rate of the polyolefin resin (C) to be blended is too high, contrarily, it also tends to result in deterioration of the bond strength and the resin physical properties, and the crystalline polyester-based elastomer (A) and the polyolefin resin (C) cause macro phase separation to sometimes result in decrease of fracture elongation and to cause an adverse effect on moldability such as impossibility of obtaining a smooth surface or the like in some cases.

The resin composition for sealing of the present invention may contain other resin such as a polyester, a polyamide, a polyolefin, a polycarbonate, acryl, and ethylene vinyl acetate which do not correspond to the crystalline polyester-based elastomer (A), the phenol-modified xylene resin (B1), the phenol resin (B2), and the polyolefin resin (C) of the present invention; as well as a curing agent such as an isocyanate compound and melamine; a filler such as talc and mica; a pigment such as carbon black and titanium oxide; and a flame retardant such as antimony trioxide and polystyrene bromide without any particular problem. These components may be blended to thereby improve the bond property, flexibility, durability, and the like. In that case, the crystalline polyester-based elastomer (A) is contained in an amount of preferably 50% by weight or more, more preferably 60% by weight or more, and furthermore preferably 70% by weight or more in the entire resin composition of the present invention. If the content of the crystalline polyester-based elastomer (A) is less than 50% by weight, excellent bond property, bond durability, elongation retention property, hydrolysis resistance and waterproofness to electrical electronic components, which the crystalline polyester-based elastomer (A) itself has, may be deteriorated.

In the case where the sealed component of the present invention is exposed to high temperature and high humidity environments for a long time, it is preferable to add an antioxidant. Examples of a hindered phenol-based antioxidant include 1,3,5-tris(3,5-di-tert-butyl-4-hydroxybenzyl)isocyanurate, 1,1,3-tri(4-hydroxy-2-methyl-5-tert-butylphenyl)butane, 1,1-bis(3-tert-butyl-6-methyl-4-hydroxyphenyl)butane, 3,5-bis(1,1-dimethylethyl)-4-hydroxy-benzenepropanoic acid, pentaerithrityl tetrakis(3,5-di-tert-butyl-4-hydroxyphenyl)propionate, 3-(1,1-dimethylethyl)-4-hydroxy-5-methyl-benzenepropanoic acid, 3,9-bis[1,1-dimethyl-2-[(3-tert-butyl-4-hydroxy-5-methylphenyl)propionyloxy]ethyl]-2,4,8,10-tetraoxaspiro[5.5]undecane, and 1,3,5-trimethyl-2,4,6-tris(3',5'-di-tert-butyl-4'-hydroxybenzyl)benzene; examples of a phosphorus-based antioxidant include 3,9-bis(p-nonylphenoxy)-2,4,8,10-tetraoxa-3,9-diphosphaspiro[5.5]undecane, 3,9-bis(octadecyloxy)-2,4,8, 10-tetraoxa-3,9-diphosphaspiro[5.5]undecane, tri(mononylphenyl)phosphite, triphenoxyphosphine, isodecyl phosphite, isodecylphenyl phosphite, diphenyl-2-ethylhexyl phosphite, dinonylphenyl bis(nonylphenyl)ester phosphorous acid, 1,1,3-tris(2-methyl-4-ditridecyl phosphite-5-tert-butylphenyl)butane, tris(2,4-di-tert-butylphenyl) phosphite, pentaerythritol bis(2,4-di-tert-butylphenyl phosphite), 2,2'-methylenebis(4,6-di-tert-butylphenyl)2-ethylhexyl phosphite, and bis(2,6-di-tert-butyl-4-methylphenyl)pentaerythritol diphosphite; examples of a thioether-based antioxidant include 4,4'-thiobis[2-tert-butyl-5-methylphenol]bis[3-(dodecylthio)propionate], thiobis[2-(1,1-dimethylethyl)-5-methyl-4,1-phenylene]bis[3-(tetradecylthio)propionate], pentaerythritol tetrakis(3-n-dodecylthiopropionate), and bis(tridecyl)thiodipropionate; and these compounds may be used alone or in form of a composite. The addition amount is preferably 0.1% by weight or more and 5% by weight or less in the entire resin composition for sealing. If it is less than 0.1% by weight, the effect for preventing heat deterioration may be insufficient in some cases. If it exceeds 5% by weight, an adverse effect may be caused on the adhesive or the like.

Examples of a method for determining the composition and the composition ratio of a polyester resin include $^1$H-NMR and $^{13}$C-NMR for measuring a polyester resin after dissolving the polyester resin in a solvent of heavy chloroform or the like, quantitative analysis by gas chromatography for measuring a polyester after methanolysis (hereinafter, sometimes abbreviated as methanolysis-GC method), and the like. In the present invention, in the case where there is a solvent which can dissolve the crystalline polyester-based elastomer (A) and is suitable for $^1$H-NMR measurement, the composition and composition ratio are determined by $^1$H-NMR. In the case where there is no proper solvent or in the case where the composition ratio cannot be specified only by $^1$H-NMR, $^{13}$C-NMR and the methanolysis-GC method may be employed or may be carried out in combination.

A conventionally known method may be employed for a method for producing the crystalline polyester-based elastomer (A) of the present invention and for example, an objective polyester resin can be obtained by carrying out esterification reaction of the above-mentioned dicarboxylic acid and a diol component at 150 to 250° C. and thereafter carrying out condensation polymerization at 230 to 300° C. under reduced pressure. Alternatively, an objective polyester resin can be obtained by carrying out transesterification of a derivative such as dimethyl ester of the dicarboxylic acid and a diol component at 150° C. to 250° C. and thereafter carrying out condensation polymerization at 230° C. to 300° C. under reduced pressure.

The melt viscosity of the resin composition for sealing of the present invention at 220° C. is desirably 5 to 3000 dPa·s and it can be satisfied by properly adjusting the types and rates of the crystalline polyester-based elastomer (A), phenol-modified xylene resin (B1) and/or phenol resin (B2), and polyolefin resin (C) to be blended. For example, the melt viscosity of the resin composition of the present invention tends to be lowered by increasing the copolymerization ratio of a polyether diol to be copolymerized with the crystalline polyester-based elastomer (A) and by lowering the molecular weight of the crystalline polyester-based elastomer (A), and the melt viscosity of the resin composition of the present invention tends to be increased by increasing the molecular weight of the crystalline polyester-based elastomer (A). The melt viscosity at 220° C. is a value measured as follows. That is, the melt viscosity is the viscosity measured by drying a resin composition for sealing to a water content 0.1% or less, and heating and stabilizing the resin composition for sealing at 220° C., and passing the resin composition for sealing through a die having a hole diameter of 1.0 mm and a thickness of 10 mm at a pressure of 98N/cm$^2$, by a flow tester (model No. CFT-500) manufactured by Shimadzu Corporation. If the melt viscosity is as high as 3000 dPa·s or more, high resin cohesion and durability can be obtained; however, at the time of sealing for a component with a complicated shape, high pressure injection molding is needed, and therefore, the component may be broken in some cases. A resin composition for sealing having a melt viscosity of 2000 dPa·s or less, preferably 1000 dPa·s or less, can be used to thereby obtain a molded component excellent in electrical insulation properties at a relatively low injection pressure of 0.1 to 100 MPa and to give an electrical electronic component without deteriorating the properties. In terms of injection operation for a resin composition for sealing, the melt viscosity at 220° C. is more preferable as it is lower, but in consideration of the bond property and cohesion of the resin composition, the lower limit is preferably 5 dPa·s or more, more preferably 10 dPa·s or more, furthermore preferably 50 dPa·s or more, and most preferably 100 dPa·s or more.

To mold the crystalline polyester-based elastomer (A) with heat deterioration suppressed as much as possible, it is required to carry out quick melting at 210 to 240° C., and therefore, the upper limit of the melting point of the polyester resin (A) is desirably 210° C. It is more preferably 200° C. The lower limit is better to be higher than the corresponding heat resistant temperature required for the use by 5 to 10° C. In consideration of the handling property at normal temperature and common heat resistance, it is 70° C. or higher, preferably 100° C. or higher, more preferably 120° C. or higher, particularly preferably 140° C. or higher, and most preferably 150° C. or higher.

In the present invention, the bond strength of a resin composition for sealing to a specified member can be determined by producing a specimen for measurement, on which 2 plate-like members are adhered with the resin composition for sealing, and measuring the shear breaking strength of the specimen. A method for producing a specimen for measurement and a method for measuring the shear breaking strength are carried out according to methods in Examples described below.

The resin composition for sealing of the present invention is typically injected into and molded in a mold in which an electrical electronic component is set. For example, a molded product can be obtained by heating and melting a resin composition, in which the crystalline polyester-based elastomer (A) is a crystalline polyester resin (A1) being copolymerized with a polyester component, at around 130 to 220° C. by using a screw type applicator for hot melt molding process, injecting the melted resin composition to a mold through an injection nozzle, keeping a prescribed cooling time, and taking the molded product out of the mold. The proper temperature for heating and melting a resin composition differs depending on the resin composition, and for example, in the case of a resin composition in which the crystalline polyester-based elastomer (A) is a crystalline polyester resin (A2) being copolymerized with a polycarbonate component, the heating and melting temperature is preferably around 200 to 280° C.

The model of the applicator for hot melt molding process is not particularly limited and examples include ST2 manufactured by Nordson, and IMC-18F9, a vertical type extruder, manufactured by Imoto Machinery Co., Ltd.

EXAMPLES

Hereinafter, the present invention will be described in detail with reference to Examples and Comparative Example; however, the present invention should not be limited to these Examples. The respective measurement values described in Examples and Comparative Examples were measured by the following methods. In addition, normal temperature and normal humidity meant environments at a temperature of about 23° C. and a relative humidity of about 65%.

<Measurement of Melting Point and Glass Transition Temperature>

Using a differential scanning calorimeter "DSC 220 model", manufactured by Seiko Electronics Industrial Co., Ltd., measurement was carried out by putting 5 mg of a measurement specimen in an aluminum pan, sealing the specimen by pressing a lid, holding it once at 250° C. for 5 minutes, quenching it with liquefied nitrogen, and thereafter carrying out heating from −150° C. to 250° C. at a rate of temperature rise of 20° C./min. The inflection point in the obtained curve was defined as the glass transition temperature and the heat absorption peak was defined as the melting point.

<<Method for Evaluating Initial Bond Property and Cooling and Heating Cycle Durability>>

<Bond Strength Test>

Method for Producing Bond Strength Specimen

An aluminum plate with a thickness of 0.5 mm (A5052, manufactured by TP Giken Co., Ltd.) was cut into a size of 70 mm×70 mm and wiped with acetone for removing oil from the surface. Next, this aluminum plate was fixed in the inside of a mold for flat plate molding (inner size of the mold: width 100 mm×length 100 mm×thickness 5 mm) and a cellophane tape with a width of 10 mm was stuck to one side of the aluminum plate. Next, a resin composition for sealing was injected through a gate provided at the center of the face of 100 mm×100 mm by using a screw type applicator for hot melt molding process (vertical type low pressure extruder IMC-18F9, manufactured by Imoto Machinery Co., Ltd.) to carry out molding. The molding conditions were set as follows: molding resin temperature: 220° C.; molding pressure: 3 MPa; keeping pressure: 3 MPa; a cooling time: 15 seconds; and discharge rotation: 50% (the maximum discharge 100%). The molded product was released and cut in a manner that the respective cut pieces were stripes with a width of 20 mm having a cellophane tape-bearing part, to give specimens for a bond strength test.

Evaluation of Initial Bond Property

Each of the above-mentioned specimens for a bond test was kept in an environment of a temperature of 23° C. and a relative humidity of 50% for 3 hours or more and 100 hours or less. Next, the aluminum plate and the resin were separated from the cellophane tape-bearing part and the T-type peeling strength was measured. The pulling speed was set to be 50 mm/min.

Evaluation Standard

AAA: The T-type peeling strength is 2.0 N/mm or more.

AA: The T-type peeling strength is less than 2.0 N/mm and 1.0 N/mm or more.

A: The T-type peeling strength is less than 1.0 N/mm and 0.5 N/mm or more.

B: The T-type peeling strength is less than 0.5 N/mm.

Cooling and Heating Cycle Test I

Each of the bond strength test specimens produced in the same manner as those for the evaluation of initial bond property was exposed to an environmental load of 1000 cycles of keeping at −40° C. for 30 minutes and then at 80° C. for 30 minutes as one cycle, successively kept still at normal temperature and normal humidity overnight, and then subjected to T-type peeling strength measurement. The T-type peeling retention ratio I defined by the following numerical formula (1) was calculated and the evaluation was carried out according to the following evaluation standard.

[Numeral formula 1]

$$T\text{-type peeling strength retention ratio } (\%) = \frac{T\text{-type peeling strength after cooling and heating cycle test } I}{\text{Initial } T\text{-type peeling strength}} \times 100 \quad (1)$$

Evaluation Standard

AAA: The T-type peeling strength retention ratio I is 80% or more.

AA: The T-type peeling strength retention ratio I is less than 80% and 70% or more.

A: The T-type peeling strength retention ratio I is less than 70% and 50% or more.

B: The T-type peeling strength retention ratio I is less than 50%.

Cooling and Heating Cycle Test II

Each of the bond strength test specimens produced in the same manner as those for the evaluation of initial bond property was exposed to an environmental load of 1000 cycles of keeping at −40° C. for 30 minutes and then at 150° C. for 30 minutes as one cycle, successively kept still at normal temperature and normal humidity overnight, and then subjected to T-type peeling strength measurement. The T-type peeling retention ratio II defined by the following numerical formula (2) was calculated and the evaluation was carried out according to the following evaluation standard.

[Numeral formula 2]

$$T\text{-type peeling strength retention ratio } II (\%) = \frac{T\text{-type peeling strength after cooling and heating cycle test } II}{\text{Initial } T\text{-type peeling strength}} \times 100. \quad (2)$$

Evaluation Standard

AAA: The T-type peeling strength retention ratio II is 80% or more.

AA: The T-type peeling strength retention ratio II is less than 80% and 70% or more.

A: The T-type peeling strength retention ratio II is less than 70% and 50% or more.

B: The T-type peeling strength retention ratio II is less than 50%.

<Melt Property Test>

Method for Evaluating Melt Viscosity of Resin and Resin Composition for Sealing

A cylinder in the center of a heating body set at 220° C. in a flow tester (CFT-500C type) manufactured by Shimadzu Corporation was filled with a resin or a resin composition for sealing dried to a water content of 0.1% or less, and 1 minute after the filling, a load was applied through a plunger, the melted sample was extruded out of a die (hole diameter: 1.0 mm and thickness 10 mm) in a cylinder bottom part by applying a pressure of 1 MPa, the descending distance and the descending time of the plunger were recorded, and the melt viscosity was calculated.

Method for Evaluation of Low Pressure Moldability

Using a mold for flat plate molding and a low pressure molding applicator IMC-18F9 manufactured by Imoto Machinery Co., Ltd. as an applicator for hot melt molding process, a flat plate (100 mm×100 mm×10 mm) of a resin composition for sealing was molded and released from the mold, the released flat plate was observed with eyes to evaluate existence of burr, sink marks, and short shots in accordance with the following evaluation standard. The gate position was at the center of the face of 100 mm×100 mm and the molding conditions were set as follows: molding resin temperature: 220° C.; molding pressure: 3 MPa; keeping pressure: 3 MPa; cooling time: 15 seconds; and discharge rotation: 50%.

Evaluation Standard

AAA: Completely packed and neither burr nor sink mark was observed.

AA: Completely packed but burr was slightly observed.

A: Packed without any short shot, but sink marks existed.

B: Short shot was observed.

<High Temperature Long Time Load Test> (Evaluation of Heat Aging Resistance)

A resin composition for sealing was injected through a gate formed in the center of the face of 100 mm×100 mm by using an applicator for a screw type hot melt molding process (vertical type low pressure extruder IMC-18F9, manufactured by Imoto Machinery Co., Ltd.) and molded to produce a flat plate with a thickness of 2 mm. The molding conditions were set as follows: molding resin temperature: 220° C.; molding pressure: 3 MPa; keeping pressure: 3 MPa; cooling time: 15 seconds; and discharge rotation: 50% (the maximum discharge 100%). A JIS 3 type dumbbell was produced by punching each of the obtained flat plates, the tensile fracture elongation was measured according to the measurement method of JIS K6251, and the obtained value was defined as "initial tensile fracture elongation". Further, each dumbbell produced in the same manner was treated in an environment of 150° C. for 1000 hours and kept still at normal temperature and normal humidity overnight, then the tensile fracture elongation measurement was carried out in the same manner, and the obtained value was defined as "tensile fracture elongation after load test at 150° C. for 1000 hours". The tensile fracture elongation retention ratio was calculated according to the following formula 2 and the result was shown according to the following evaluation standard.

[Numeral formula 3]

$$\text{Tensile fracture elongation retention ratio (\%)} = \frac{\text{tensile fracture elongation after load test at 150° C. for 1000 hours}}{\text{Initial tensile fracture elongation}} \times 100 \quad (3)$$

Evaluation Standard

AAA: The tensile fracture elongation retention ratio is 65% or more.

AA: The tensile fracture elongation retention ratio is less than 65% and 50% or more.

A: The tensile fracture elongation retention ratio is less than 50% and 30% or more.

B: The tensile fracture elongation retention ratio is less than 30%.

The compounds and/or residual groups used in Examples and Comparative Examples of the present invention were abbreviated as follows.

TPA: terephthalic acid

NDC: naphthalene dicarboxylic acid

BD: 1,4-butanediol

PTMG1000: poly tetramethylene ether glycol (the number average molecular weight is 1000)

PTMG2000: poly tetramethylene ether glycol (the number average molecular weight is 2000)

PCL: polycaprolactone (the number average molecular weight is 850)

PBT: polybutylene terephthalate

PBN: polybutylene naphthalate

Polyolefin A: EXCELLEN VL EUL731, manufactured by Sumitomo Chemical, Co., Ltd., ethylene-α-olefin copolymer, density 0.90, MFR 10 g/10 min.

Polyolefin B: Admer SF-600, manufactured by Mitsui Chemicals, Inc., adhesive polyolefin, density 0.88, MFR 3.3 g/10 min.

Polyolefin C: HI-ZEX 2100J, manufactured by Prime Polymer Co., Ltd., high density polyethylene, density 0.93, MFR 5.8 g/10 min.

Phenol-modified alkylbenzene resin A: Nikanol HP-150, manufactured by Fudow Co., Ltd., phenol-modified xylene resin, hydroxyl value 3025 equivalent/$10^6$ g.

Phenol-modified alkylbenzene resin B: Nikanol HP-100, manufactured by Fudow Co., Ltd., phenol-modified xylene resin, hydroxyl value 2500 equivalent/$10^6$ g.

Phenol-modified alkylbenzene resin C: Nikanol L5, manufactured by Fudow Co., Ltd., phenol-modified xylene resin (EO adduct type), hydroxyl value 625 equivalent/$10^6$ g.

Phenol resin A: CKM 2400, manufactured by Showa Highpolymer Co., Ltd., a novolak type phenol resin, hydroxyl value 9000 equivalent/$10^6$ g.

Phenol resin B: EP 4020, manufactured by Asahi Organic Chemicals Industry Co., Ltd., a cresol novolac type phenol resin, hydroxyl value 9250 equivalent/$10^6$ g.

Production Example of Polyester Resin I-A

A reaction vessel equipped with a stirrer, a thermometer, and a cooler for distillate was loaded with 100% by mole of terephthalic acid and 1,4-butanediol in amount proper to give 60% by mole in the case where the total of glycol component was set to be 100% by mole. Thereafter, 0.25 parts by mass of tetrabutyl titanate was added to 100 parts by mass in total of the loaded substances and then esterification reaction was carried out at 170 to 220° C. for 2 hours. After completion of the esterification reaction, 40% by mole, the remaining amount, of polytetramethylene glycol "PTMG 1000" (manufactured by Mitsubishi Chemical Corporation) with a number average molecular weight of 1000 was loaded and further 0.5 parts by mass of a hindered phenol type antioxidant "Irganox 1330" (manufactured by Ciba-Geigy Corp.) was added and the reaction mixture was heated to 255° C. and on the other hand, the pressure in the reaction system was slowly reduced to 665 Pa at 255° C. for 60 minutes. Further, condensation polymerization reaction was carried out at 133 Pa or less for 30 minutes to obtain a polyester resin I-A. The melting point of this polyester resin I-A was 165° C. and the melt viscosity was 500 dPa·s.

Production Example of Polyester Resins I-B to I-D

Polyester resins I-B to I-D were obtained in the same manner as in Production Example of the polyester resin I-A, except that the types and ratios of the raw materials were changed to carry out the reaction. The compositions and physical properties of these polyester resins I-B to I-D are shown in Table 1.

TABLE 1

| | polyester resin | | I-A | I-B | I-C | I-D |
|---|---|---|---|---|---|---|
| mol % of component | dicarboxylic acid component | TPA | 100 | | 100 | 100 |
| | | NDC | | 100 | | |
| | diol component | BD | 60 | 58 | 72 | 80 |
| | | EG | | | | |
| | | PTMG1000 | 40 | | 28 | |

TABLE 1-continued

| polyester resin | | | I-A | I-B | I-C | I-D |
|---|---|---|---|---|---|---|
| | PTMG2000 | | | | 42 | |
| | PCL | | | | | 20 |
| properties | melt viscosity dPa · s | | 500 | 350 | 250 | 5000 |
| | melting point ° C. | | 165 | 159 | 165 | 210 |
| | glass transition temperature ° C. | | −80 | −80 | −75 | −20 |

Production Example of Resin Compositions for Sealing Electrical Electronic Components I-1 to I-26

The resin composition for sealing electrical electronic components I-1 was obtained by evenly mixing 100 parts by mass of the polyester resin I-A, 20 parts by mass of the polyolefin resin A, and 10 parts by mass of the epoxy resin A, and thereafter melting and kneading the mixture at a die temperature of 220° C. by using a biaxial extruder. The polyester resin compositions I-2 to I-26 were prepared by the same method for producing the polyester resin composition I-1, except that the blending components and ratios were changed. The respective compositions are shown in Table 2 and Table 3.

TABLE 2

| | | | Example I-1 | Example I-2 | Example I-3 | Example I-4 | Example I-5 | Example I-6 | Example I-7 |
|---|---|---|---|---|---|---|---|---|---|
| name of resin composition for sealing | | | I-1 | I-2 | I-3 | I-4 | I-5 | I-6 | I-7 |
| blend of resin composition (parts by weight) | polyester resin I-A | | 100 | | | | | 100 | |
| | polyester resin I-B | | | 100 | | | | | |
| | polyester resin I-C | | | | 100 | 100 | 100 | | 100 |
| | polyester resin I-D | | | | | | | | |
| | phenol-modified xylene resin A | | 10 | 5 | 10 | 10 | | 30 | |
| | phenol-modified xylene resin B | | | | | | 5 | | |
| | phenol-modified xylene resin C | | | | | | | | 15 |
| | phenol resin A | | | | | | | | |
| | phenol resin B | | | | | | | | |
| | polyolefin resin A | | 20 | | 30 | | 30 | | 30 |
| | polyolefin resin B | | | 10 | | 20 | | | |
| | polyolefin resin C | | | | | | | 20 | |
| melt property test | melt viscosity of resin composition dPa · s | | 846 | 609 | 982 | 1224 | 564 | 2880 | 792 |
| | evaluation of low pressure moldability | | AA | AA | AA | AA | AA | A | AA |
| bond strength test | T-type peeling strength | initial | AA | AAA | AA | AA | AA | AAA | AA |
| | | after cooling and heating cycle test I | AA | A | AAA | AA | AA | A | AA |
| | T-type peeling strength retention ratio | after cooling and heating cycle test I | AAA | A | AAA | AA | AAA | A | AA |

TABLE 3

| | | | Example I-8 | Example I-9 | Comparative Example I-1 | Comparative Example I-2 | Comparative Example I-3 | Comparative Example I-4 | Comparative Example I-5 |
|---|---|---|---|---|---|---|---|---|---|
| name of resin composition for sealing | | | I-8 | I-9 | I-10 | I-11 | I-12 | I-13 | I-14 |
| blend of resin composition (parts by weight) | polyester resin I-A | | | | | 100 | 100 | 100 | |
| | polyester resin I-B | | | | | | | | 100 |
| | polyester resin I-C | | 100 | 100 | | | | | |
| | polyester resin I-D | | | | 100 | | | | |
| | phenol-modified xylene resin A | | | | | 5 | 10 | | |
| | phenol-modified xylene resin B | | | | | | | | |
| | phenol-modified xylene resin C | | | | | | | | |
| | phenol resin A | | 15 | | | | | | 30 |
| | phenol resin B | | | 15 | | | | | |
| | polyolefin resin A | | 30 | 30 | 40 | | 20 | | |
| | polyolefin resin B | | | | | | | 20 | |
| | polyolefin resin C | | | | | | | | |
| melt property test | melt viscosity of resin composition dPa · s | | 800 | 800 | 3414 | 273 | 1042 | 1042 | 135 |
| | evaluation of low pressure moldability | | AA | AA | B | AA | AA | AA | AA |
| bond strength test | T-type peeling strength | initial | AAA | A | A | A | B | B | AA |
| | | after cooling and heating cycle test I | AA | AA | A | B | B | B | B |
| | T-type peeling strength retention ratio | after cooling and heating cycle test I | AA | AA | AA | B | B | B | B |

Example I-1

The resin composition for sealing I-1 was used as a resin composition for sealing, and "Melt property test" and "Bond strength test" were performed. In "Melt property test", a good melt property of 846 dPa·s was obtained. In "Bond strength test", for an aluminum plate specimen for the bond test, the initial bond strength was 1.2 MPa and the bond strength after cooling and heating cycle test was 1.0 MPa, and the results were good in all items showing a high bond strength retention ratio. The results are shown in Table 2.

Examples I-2 to I-9

The resin compositions for sealing I-2 to I-9 were used as a resin composition for sealing, and "Melt property test" and "Bond strength test" were performed in the same manner as in Example I-1. The results are shown in Table 2.

Comparative Example I-1

The resin composition for sealing I-10 was used as a resin composition for sealing, and "Melt property test" and "Bond strength test" were performed in the same manner as in Example I-1. In "Melt property test", the result was 3414 dPa·s, which was out of a moldable range, and in "Bond strength test", for an aluminum plate specimen for the bond test, the initial bond strength was 0.9 MPa and the bond strength after cooling and heating cycle test was 0.7 MPa, and thus both satisfied the required properties and also satisfied the bond strength retention ratio, but molding failure occurred owing to short and it was found defective. The results are shown in Table 3.

Comparative Example I-2

The resin composition for sealing I-11 was used as a resin composition for sealing, and "Melt property test" and "Bond strength test" were performed in the same manner as in Example I-1. In "Melt property test", the result was 273 dPa·s, which was within a moldable range, and in "Bond strength test", for an aluminum plate specimen for the bond test, the initial bond strength was 0.8 MPa and the bond strength after cooling and heating cycle test was 0.1 MPa, and thus the result failed to satisfy the required properties. The results are shown in Table 3.

Comparative Examples I-3 to I-6

The resin compositions for sealing I-12 to I-15 were used as a resin composition for sealing, and "Melt property test" and "Bond strength test" were performed in the same manner as in Example I-1. The results are shown in Table 2. The results are shown in Table 3.

Production Example of Aliphatic Polycarbonate Diol A

A reaction container was loaded with 100 parts by mass of poly(hexamethylene carbonate)diol (number average molecular weight 2000) and 9.6 parts by mass of diphenyl carbonate and reaction was carried out at a temperature of 205° C. and at 130 Pa. Two hours later, the content was cooled and the produced polymer was taken out to obtain an aliphatic polycarbonate diol A. The number average molecular weight of the aliphatic polycarbonate diol A was 13000.

Production Example of Aliphatic Polycarbonate Diol B

An aliphatic polycarbonate diol B was obtained in the same manner as in Production Example of aliphatic polycarbonate diol A, except that poly(hexamethylene carbonate)diol was changed to poly(tetramethylene carbonate)diol (number average molecular weight 2000). The number average molecular weight of the aliphatic polycarbonate diol B was 13000.

Production Example of Polyester Resin Composition II-A

As a hard segment component, 100 parts by mass of poly(butylene terephthalate) (PBT) with a number average molecular weight of 20000, and as a soft segment component, 150 parts by mass of the aliphatic polycarbonate diol A were stirred at 230° C. to 245° C. and 130 Pa for 1 hour and it was confirmed that the resulting resin was transparent. Thereafter, phenylphosphonic acid in an amount corresponding to 60 ppm of a phosphorus atom was added under nitrogen current and the contents were stirred for 10 minutes in slightly reduced pressure (>300 Pa), and then the contents were taken out and cooled. Still next, 0.3 parts of Lasmit LG and 0.3 parts of Irgnox 1010 were added, and the contents were kneaded at 250° C. to obtain a polyester resin composition II-A. The polyester resin composition A was found containing mainly a crystalline polyester resin having 13 eq/ton of the terminal vinyl group.

Production Example of Polyester Resin Compositions II-B to II-E

Polyester resin compositions II-B to were produced in the same manner as in Production Example of polyester resin composition II-A, except that the types and the blending amounts of the hard segment component and the soft segment component were changed. The compositions and physical properties of the polyester resin compositions to II-E are shown in Table 1.

Production Example of Polyester Resin Composition F

A reaction vessel equipped with a stirrer, a thermometer, and a cooler for distillate was loaded with 100% by mole of terephthalic acid, 75% by mole of 1,4-butanediol, and tetrabutyl titanate in an amount of 0.25% by weight in the total weight of terephthalic acid and 1,4-butanediol, and esterification reaction was carried out at 170 to 220° C. for 2 hours. After completion of the esterification reaction, 25% by mole of polytetramethylene glycol "PTMG 1000" (manufactured by Mitsubishi Chemical Corporation) with a number average molecular weight of 1000 and 0.5 parts by mass of a hindered phenol type antioxidant "Irganox 1330" (manufactured by Ciba-Geigy Corp.) were added and the reaction mixture was heated to 250° C. and on the other hand, the pressure in the reaction system was slowly reduced to 665 Pa at 250° C. for 60 minutes. Further, condensation polymerization reaction was carried out at 133 Pa or less for 30 minutes to obtain a polyester resin F. The melting point of this polyester resin F was 190° C. and the melt viscosity was 500 dPa·s.

Production Example of Polyester Resin Compositions G

Resin compositions G were produced in the same manner as in Production Example of polyester resin composition F, except that terephthalic acid was changed to naphthalene dicarboxylic acid. The compositions and physical properties of the polyester resin compositions G are shown in Table 1.

TABLE 4

| polyester resin | | | II-A | II-B | II-C | II-D | II-E | II-F | II-G |
|---|---|---|---|---|---|---|---|---|---|
| mol % of component | hard segment | PBT | 60 | 40 | 80 | 20 | 40 | | 40 |
| | soft segment | PBN | | | | | | 50 | |
| | | aliphatic polycarbonate diol A | 40 | 60 | 20 | 80 | | | |
| | | aliphatic polycarbonate diol B | | | | | 60 | | |
| | | PTMG1000 | | | | | | 50 | 60 |
| properties | melt viscosity dPa·s | | 900 | 700 | 3000 | 300 | 1000 | 500 | 100 |
| | melting point ° C. | | 200 | 190 | 215 | 150 | 190 | 190 | 160 |
| | glass transition temperature ° C. | | −40 | −40 | −20 | −40 | −40 | −75 | −70 |

Example II-1

The resin composition for sealing electrical electronic components II-1 was obtained by evenly mixing 100 parts by mass of the polyester resin A, 20 parts by mass of the polyolefin resin A, and 10 parts by mass of the epoxy resin A, and thereafter melting and kneading the mixture at a die temperature of 220° C. to 240° C. by using a biaxial extruder. The melt property, initial bond property, cooling and heating cycle durability, and heat aging resistance of the resin composition for sealing electrical electronic components II-1 were evaluated by the methods described above. In "Melt property test", a good melt property of 1000 dPa·s was obtained. In "Bond strength test", the initial bond strength was 1.0 MPa, the bond strength after cooling and heating cycle test was 1.0 MPa, and the T-type peeling strength retention ratio was 100%. In "High temperature long time load test", the tensile fracture elongation retention ratio was 75%. The results are shown in Table 5.

Examples II-2 to II-10 and Comparative Examples II-1 to II-6

Resin compositions for sealing electrical electronic components II-2 to II-16 were produced and evaluated in the same manner as in Example II-1 except that the blending was changed as shown in Tables 5 to 7. The results are shown in Tables 5 to 7.

TABLE 5

| | | | Example II-1 | Example II-2 | Example II-3 | Example II-4 | Example II-5 | Example II-6 |
|---|---|---|---|---|---|---|---|---|
| name of resin composition for sealing | | | II-1 | II-2 | II-3 | II-4 | II-5 | II-6 |
| blend of resin composition (parts by weight) | polyester resin II-A | | 100 | 100 | 100 | 100 | 100 | |
| | polyester resin II-B | | | | | | | 100 |
| | polyester resin II-C | | | | | | | |
| | polyester resin II-D | | | | | | | |
| | polyester resin II-E | | | | | | | |
| | polyester resin II-F | | | | | | | |
| | polyester resin II-G | | | | | | | |
| | polyolefin A | | 20 | | 30 | | 20 | 30 |
| | polyolefin B | | | 10 | | 20 | | |
| | polyolefin C | | | | | | | |
| | phenol-modified xylene resin A | | 10 | 5 | 10 | 10 | | |
| | phenol-modified xylene resin B | | | | | | | 5 |
| | phenol-modified xylene resin C | | | | | | | |
| | phenol resin A | | | | | | 10 | |
| | phenol resin B | | | | | | | |
| melt property test | melt viscosity of resin composition dPa·s | | 1000 | 761 | 1214 | 1154 | 980 | 1163 |
| | evaluation of low pressure moldability | | AA | AA | AA | AA | AA | AA |
| bond strength test | T-type peeling strength | initial | AA | AAA | AA | AA | AA | AA |
| | | after cooling and heating cycle test II | AA | A | AAA | AA | AA | AA |
| | T-type peeling strength retention ratio | after cooling and heating cycle test II | AA | A | AAA | AA | AA | AAA |
| high temperature long time load test | elongation retention ratio | after test at 150° C. for 1000 hours | AAA | AAA | AAA | AAA | AAA | AA |

TABLE 6

| | | Example II-7 | Example II-8 | Example II-9 | Example II-10 | Comparative Example II-1 | Comparative Example II-2 |
|---|---|---|---|---|---|---|---|
| name of resin composition for sealing | | II-7 | II-8 | II-9 | II-10 | II-11 | II-12 |
| blend of resin | polyester resin II-A | | | | | | |

TABLE 6-continued

|  |  | Example II-7 | Example II-8 | Example II-9 | Example II-10 | Comparative Example II-1 | Comparative Example II-2 |
|---|---|---|---|---|---|---|---|
| composition (parts by weight) | polyester resin II-B | 100 | 100 |  | 100 |  |  |
|  | polyester resin II-C |  |  |  |  | 100 |  |
|  | polyester resin II-D |  |  |  |  |  | 100 |
|  | polyester resin II-E |  |  | 100 |  |  |  |
|  | polyester resin II-F |  |  |  |  |  |  |
|  | polyester resin II-G |  |  |  |  |  |  |
|  | polyolefin A |  | 30 | 20 | 30 | 75 |  |
|  | polyolefin B |  |  |  |  |  |  |
|  | polyolefin C | 20 |  |  |  |  |  |
|  | phenol-modified xylene resin A | 30 |  | 10 |  | 5 | 10 |
|  | phenol-modified xylene resin B |  |  |  |  |  |  |
|  | phenol-modified xylene resin C |  | 15 |  |  |  |  |
|  | phenol resin A |  |  |  |  |  |  |
|  | phenol resin B |  |  |  | 15 |  |  |
| melt property test | melt viscosity of resin composition dPa·s | 2351 | 1110 | 1038 | 1121 | 3017 | 218 |
|  | evaluation of low pressure moldability | A | AA | AA | AA | B | AA |
| bond strength test | T-type peeling strength initial | AAA | AA | AA | A | AA | AA |
|  | T-type peeling strength after cooling and heating cycle test II | A | AA | AA | AA | AA | B |
|  | T-type peeling strength retention ratio after cooling and heating cycle test II | A | AA | AA | AA | A | B |
| high temperature long time load test | elongation retention ratio after test at 150° C. for 1000 hours | AA | AA | A | AA | AAA | AA |

TABLE 7

|  |  | Comparative Example II-3 | Comparative Example II-4 | Comparative Example II-5 | Comparative Example II-6 | Comparative Example II-7 | Comparative Example II-8 |
|---|---|---|---|---|---|---|---|
| name of resin composition for sealing |  | II-13 | II-14 | II-15 | II-16 | II-17 | II-18 |
| blend of resin composition (parts by weight) | polyester resin II-A |  |  |  |  |  |  |
|  | polyester resin II-B |  |  |  |  |  |  |
|  | polyester resin II-C |  |  |  |  |  | 100 |
|  | polyester resin II-D |  |  |  |  |  |  |
|  | polyester resin II-E |  |  |  | 100 |  |  |
|  | polyester resin II-F | 100 |  |  | 100 |  |  |
|  | polyester resin II-G |  | 100 |  |  | 100 |  |
|  | polyolefin A | 30 | 20 | 20 |  |  |  |
|  | polyolefin B |  |  |  | 20 |  | 90 |
|  | polyolefin C |  |  |  |  |  |  |
|  | phenol-modified xylene resin A | 10 | 10 |  |  |  |  |
|  | phenol-modified xylene resin B |  |  |  |  |  |  |
|  | phenol-modified xylene resin C |  |  |  |  |  |  |
|  | phenol resin A |  |  |  |  | 30 |  |
|  | phenol resin B |  |  |  |  |  | 10 |
| melt property test | melt viscosity of resin composition dPa·s | 1286 | 831 | 1300 | 1250 | 185 | 4235 |
|  | evaluation of low pressure moldability | AA | AA | AA | AA | AA | B |
| bond strength test | T-type peeling strength initial | AA | AA | B | B | AA | A |
|  | T-type peeling strength after cooling and heating cycle test II | AAA | AA | B | B | B | A |
|  | T-type peeling strength retention ratio after cooling and heating cycle test II | AAA | AA | B | B | B | AA |
| high temperature long time load test | elongation retention ratio after test at 150° C. for 1000 hours | B | B | A | B | B | AA |

In the case of Comparative Example II-1, the initial bond strength was 0.8 MPa in "Bond strength test" and the bond strength was 0.7 MPa after the cooling and heating cycle test, and thus both of initial bond strength and cooling and heating cycle durability were excellent, and the retention ratio was 80% in "High temperature long time load test", satisfying the required condition; however, the melt viscosity was as high as 3017 dPa·s, which was out of a moldable range, in "Melt property test", and molding defects were generated owing to short in the low pressure molding evaluation, and thus it could not stand for practical use as a resin composition for sealing electrical electronic components. The results are shown in Table 3.

In the case of Comparative Example II-2, the initial bond strength was 0.9 MPa in "Bond strength test" and the bond strength was 0.1 MPa after the cooling and heating cycle test, and thus the initial bond strength was excellent but the heating cycle durability was inferior. In "High temperature long time load test", the retention ratio was 55%, relatively good result. The results are shown in Table 3.

Production Example of Polyester Resin Compositions III-A to III-C

Polyester resin compositions III-A to III-C were produced in the same manner as in Production Example of polyester resin composition I-A, except that the types and ratios of the raw materials were changed to carry out the reaction. The compositions and physical properties of the polyester resin compositions II-B to II-D are shown in Table 1.

TABLE 8

| | polyester resin | | III-A | III-B | III-C |
|---|---|---|---|---|---|
| mol % of component | dicarboxylic acid component | TPA | 100 | 100 | 100 |
| | diol component | butanediol | 60 | 60 | 60 |
| | | dimer diol | 40 | | |
| | | dodecane glycol | | 40 | |
| | | polycaprolactone | | | 40 |
| properties | melt viscosity dPa · s | | 150 | 250 | 500 |
| | melting point ° C. | | 165 | 165 | 170 |
| | glass transition temperature ° C. | | −50 | −50 | −20 |

Examples III-1 to II-3 and Comparative Examples III-1 to III-3

Resin compositions for sealing electrical electronic components II-2 to II-16 were produced and evaluated in the same manner as in Example I-1 except that the blending was changed as shown in Tables 9. The results are shown in Tables 9.

INDUSTRIAL APPLICABILITY

A resin composition for sealing electrical electronic components of the present invention is excellent in melt fluidity and initial bond strength to an aluminum material, and exhibits high bond durability even after loaded with a cooling and heating cycle load. Further, a resin composition for sealing electrical electronic components of a particular embodiment of the present invention keeps adhesion strength, exhibiting highly advanced cooling and heating cycle durability, even after being subjected to a cooling and heating cycle load of 1000 cycles of −40° C. for 30 minutes and either 80° C. or 150° C. for 30 minutes, and keeps rupture elongation, exhibiting a highly advanced heat aging resistance, even after being subjected to a high temperature long time load at 150° C. for 1000 hours. Accordingly, the resin composition for sealing electrical electronic components of the present invention and a sealed body obtained by sealing with the resin composition are useful for sealed electrical electronic components which may be exposed to severe environmental loads such as cooling and heating cycles and high temperature long time load, for example, various connectors for automobiles, communication, computers, and domestic appliances; harnesses and electronic parts; switches having printed boards; and molded products of sensors.

The invention claimed is:

1. A resin composition for sealing electrical electronic components, containing
    a crystalline polyester-based elastomer (A),
    a phenol-modified alkylbenzene resin (B1), and
    a polyolefin resin (C),
and having a melt viscosity of 5 dPa·s or more and 3000 dPa·s or less when dried to a water content of 0.1% or less, heated to 220° C., subjected to a pressure of 1 MPa, and extruded through a die with a hole diameter of 1.0 mm and a thickness of 10 mm.

2. The resin composition for sealing electrical electronic components according to claim 1, wherein the crystalline polyester-based elastomer (A) is one resin or a mixture of 2 or more resins selected from the group consisting of a crystalline polyester resin (A1) being copolymerized with a polyether component, a crystalline polyester resin (A2) being copolymerized with a polycarbonate component, and a crystalline polyester resin (A3) being copolymerized with a polylactone component.

TABLE 9

| | | | Example III-1 | Comparative Example III-1 | Example III-2 | Comparative Example III-2 | Example III-3 | Comparative Example III-3 |
|---|---|---|---|---|---|---|---|---|
| name of resin composition for sealing | | | III-1 | III-2 | III-3 | III-4 | III-5 | III-6 |
| blend of resin composition (parts by weight) | crystalline polyester resin III-A | | 100 | 100 | | | | |
| | crystalline polyester resin III-B | | | | 100 | 100 | | |
| | crystalline polyester resin III-C | | | | | | 100 | 100 |
| | polyolefin A | | 30 | 30 | 30 | | 30 | 30 |
| | phenol-modified xylene resin A | | 30 | | 30 | 30 | 30 | |
| melt property test | melt viscosity of resin composition dPa · s | | 450 | 735 | 636 | 551 | 1230 | 1463 |
| | evaluation of low pressure moldability | | AA | AA | AA | AA | AA | AA |
| bond strength test | T-type peeling strength | initial | AA | B | AA | AA | AA | B |
| | | after cooling and heating cycle test I | AA | B | AA | B | A | B |
| | T-type peeling strength retention ratio | after cooling and heating cycle test I | AA | A | AA | B | A | B |

3. The resin composition according to claim 1, wherein the phenol-modified alkylbenzene resin (B1) is an alkylphenol-modified alkylbenzene resin and has a hydroxyl value of 100 equivalent/$10^6$ g or more.

4. The resin composition according to claim 1, wherein 0.1 to 100 parts by weight in total of the phenol-modified alkylbenzene resin (B1) and 0.1 to 100 parts by weight of the polyolefin resin (C) are blended with 100 parts by weight of the crystalline polyester-based elastomer (A).

5. The resin composition for sealing electrical electronic components according to claim 1, having a T type peeling strength retention ratio of 50% or more after applying 1000 cycles of cooling and heating cycle at −40° C. for 30 minutes and at 80° C. for 30 minutes for an aluminum plate.

6. The resin composition for sealing electrical electronic components according to claim 1, having an initial T type peeling strength of 0.5 N/mm or more for an aluminum plate.

7. A method for producing a sealed electrical electronic component by heating and kneading the resin composition according to claim 1 and thereafter injecting the resin composition into a mold including an inserted electrical electronic component at a resin composition temperature of 130° C. or higher and 260° C. or lower and at a resin composition pressure of 0.1 MPa or more and 10 MPa or less.

8. A sealed electrical electronic component sealed with the resin composition according to claim 1.

* * * * *